(12) United States Patent
Lebizay et al.

(10) Patent No.: US 7,218,640 B2
(45) Date of Patent: May 15, 2007

(54) MULTI-PORT HIGH-SPEED SERIAL FABRIC INTERCONNECT CHIP IN A MESHED CONFIGURATION

(75) Inventors: Gerald Lebizay, Madison, NJ (US); Brian E. Peebles, Cranford, NJ (US); David W. Gish, Riverdale, NJ (US); Don V. Massa, Paterson, NJ (US); Jay L. Gerbehy, Califon, NJ (US)

(73) Assignee: Intel Corporation, Santa Clara, CA (US)

( * ) Notice: Subject to any disclaimer, the term of this patent is extended or adjusted under 35 U.S.C. 154(b) by 1064 days.

(21) Appl. No.: 10/231,832

(22) Filed: Aug. 30, 2002

(65) Prior Publication Data

US 2004/0042448 A1    Mar. 4, 2004

(51) Int. Cl.
*H04L 12/56*    (2006.01)
(52) U.S. Cl. .................. 370/429; 370/413; 370/419; 710/52
(58) Field of Classification Search ........... 370/392, 370/389, 404, 452, 412, 362, 400, 429, 394, 370/413, 419; 709/249, 223, 246, 228; 398/45, 398/48, 56, 59; 711/144; 710/104–6, 244, 710/33, 52
See application file for complete search history.

(56) References Cited

U.S. PATENT DOCUMENTS 4,866,704 A * 9/1989 Bergman .................... 370/452
6,320,863 B1 * 11/2001 Ramfelt ...................... 370/404
6,725,296 B2 * 4/2004 Craddock et al. ............. 710/52
6,766,381 B1 * 7/2004 Barker et al. ................ 709/246
6,928,470 B1 * 8/2005 Hamlin ....................... 709/223

FOREIGN PATENT DOCUMENTS

EP          0 844 763        5/1998
WO       WO 02/052422       7/2002

OTHER PUBLICATIONS

Ducuypere, Hubert, Pauwels, Bart, and Marx, Guido, "Advanced switching technology enable for router security," Alcatel Telecommunications Review, Alcatel, Paris Cedex, FR, Jul. 2002, XP007005878, ISSN: 1267-7167.

(Continued)

*Primary Examiner*—John Pezzlo
(74) *Attorney, Agent, or Firm*—Pillsbury Winthrop Shaw Pittman LLP

(57) ABSTRACT

Multiple boards are connected within a chassis, using a multi-port Target Channel Adapter (TCA). Data is transported from a TCA on a board directly to a TCA on another board through a meshed backplane. The meshed backplane is equipped to mount boards via connectors and may consist of a fabric of copper conductors or optical fibers. Communication from TCA to TCA requires placing ports on each individual TCA along with the appropriate input and output buffering. A multi-port TCA capable of performing multiple bridging functions simultaneously i.e., bridging from a high speed serial meshed backplane to multiple local busses, i.e., Gigabit Ethernet, Fibre Channel, and TCP/IP devices, is referred to as a Fabric Interconnect Chip (FIC).

17 Claims, 6 Drawing Sheets

OTHER PUBLICATIONS

Jonsson, M. and Olin, U.; "Optical interconnection technology in switches, routers and optical cross connects," School of Information Science, Computer and Electrical Engineering, Halmstad University, Sweeden, Oct. 13, 2000.

"Next-Generation Backplanes," Elma Bustronic Product Description XP002262795, retrieved from Internet at http://webarchive.org/web/20020803110952/http://www.nextgenbackplanes.com/switch.html; retrieved on Nov. 25, 2003.

Prunty, Craig, and Palkert, Tom, "Serial Backplanes Transport Designers to the Analog Zone," Boards and Buses, Sep. 20, 1999, pp. 79-80, 82, 84, and 86.

* cited by examiner

The enclosure contains the optical fibers that form the dual counter-rotating ring. Each connector has transmit and receive fiber pairs in each direction to each of its nearest neighbors. Fibers pass between the two end connectors to compelete the rings.

MULTI-PORT HIGH-SPEED SERIAL FABRIC INTERCONNECT CHIP IN A MESHED CONFIGURATION

BACKGROUND OF THE INVENTION

1. Technical Field

The present invention relates to computing systems, and specifically to systems that use high speed serial packet-switching fabrics, such as the InfiniBand architecture and PCI-Express.

2. Discussion of the Related Art

In current-generation computers, the central processing unit (CPU) is connected to the system memory and to peripheral devices by a shared parallel bus, such as the Peripheral Component Interface (PCI) bus or the Industry Standard Architecture (ISA) bus. Essentially, a bus is the channel or path between components in a computer. Likewise, current server to server connections and links to other server-related systems, such as remote storage and networking devices, depend on parallel bus technology. Server design dependent on a shared bus input/output (I/O) architecture may deliver for example 512 megabytes per second (MB/sec) of potential bandwidth that is shared among devices connected to the bus.

As data path-widths grow, and clock speeds become faster, the shared parallel bus becomes too costly and complex to keep up with system demands. In response, the computer industry is working to develop next-generation bus standards. Many of the proposed new standards have something in common. They propose doing away with the shared-bus technology used in PCI and moving to a point-to-point switching connection. Thus, the computer industry is moving towards fast, packetized, serial input/output bus architectures, in which computing hosts and peripherals are linked by a switching network, commonly referred to as a switching fabric. A number of architectures of this type have been proposed, and the first next-generation standard is already in place. InfiniBand has been advanced by a consortium headed by a group of industry leaders and PCI-Express is soon to follow.

The InfiniBand architecture is an I/O infrastructure technology that simplifies and speeds server-to-server connections and links to other server related systems, such as remote storage and network devices. The Infiniband fabric or mesh is the central network of connections between nodes, i.e., servers, and remote networking and storage devices within a data center. Infiniband architecture also constructs highly available data centers through multiple levels of redundancy. By connecting nodes via multiple links, Infiniband systems continue to perform even if one link fails. For increased reliability, multiple switches in a fabric provide redundant paths that allow for seamless re-routing of data through the fabric should a link between switches fail. Completely redundant fabrics may be configured for the highest level of reliability and may continue to perform even if an entire fabric fails.

Each node connects to the fabric through a channel adapter. Infiniband classifies the channel adapter into two categories: Host Channel Adapters (HCA) and Target Channel Adapters (TCA). HCAs are present in servers or even desktop machines and provide an interface that is used to integrate the InfiniBand with the operating system. TCAs are present on I/O devices such as a Redundant Array of Independent Disks (RAID) subsystem or a Just a Bunch of Disks (JBOD) subsystem. Each channel adapter may have one or more ports. A channel adapter with more than one port, may be connected to multiple switch ports. This allows for multiple paths between a source and a destination, resulting in performance and reliability benefits.

Infiniband channel adapters essentially have their own intelligence, therefore, they offload some of the communication processing from the operating system and CPU. Host and Target Channel adapters present an interface to the Open Systems Interconnection (OSI) reference model layers above them that allow those layers to generate and consume packets. In the case of a server writing a file to a storage device, the host is generating the packets that are then consumed by the storage device. In contrast to the channel adapter, switches simply forward packets between two of their ports based on an established routing table and the addressing information stored on the packets.

Infiniband uses Internet Protocol Version 6 (IPv6) headers natively, and can connect to Local Area Network (LAN) and Wide Area Network (WAN) switches and routers with the TCA providing a seamless transition between the system area network and external networks. InfiniBand defines network layers up to the transport layer and offers all four combinations of reliable/unreliable and connection datagram service. The Infiniband transport protocol is used within the system area network, but other transport protocols can be accessed by sending raw packets via a TCA. TCAs provide connections to storage, fibre channel networks, and other I/O nodes, and include an I/O controller specific to the device's protocol, be it Small Computer Systems Interface (SCSI), Ethernet, etc. A TCA includes an Infiniband protocol engine that dramatically accelerates the performance of critical Infiniband transport functions in the TCA's hardware, achieving aggregate internal transaction switching throughput speeds of 150 gigabits per second. TCAs are highly optimized for Infiniband target applications such as bridging from Infiniband devices (switches) to local busses i.e., Gigabit Ethernet, Fibre Channel, and Transport Control Protocol/Internet Protocol TCP/IP devices, as well as next-generation I/O protocols.

DETAILED DESCRIPTION

Figure 1:
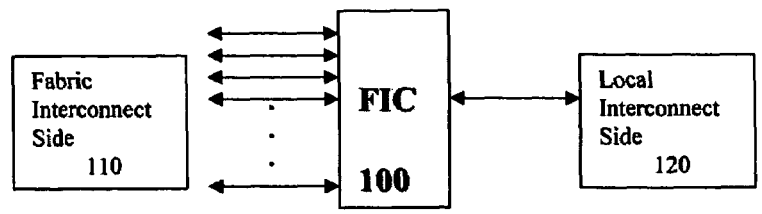
FIG. 1 depicts the connection of a Fabric Interconnect Chip according to an embodiment of the present invention.

The Infiniband architecture is similar to the Virtual Interface (VI) Architecture (VIA) for operation at the OSI transport level. The VIA is a server messaging protocol whose focus is to provide a very low latency link between the communicating servers. The specification defines four basic components: virtual interfaces, completion queues, VI Providers, and VI Consumers.

In transferring a block of data from one server to another, latency arises in the form of overhead and delays that are added to the time needed to transfer the actual data. If latency is broken down into components, the major contributors are: a) the overhead of executing network protocol code within the operating system, b) context switches to move in and out of kernel mode to receive and send out the data, and c) excessive copying of data between the user level buffers and the Network Interface Chip (NIC) memory.

Since VIA was only intended to be used for communication across the physical servers of a cluster (in other words across high-bandwidth links with very high reliability), the specification eliminates much of the standard network protocol code that deals with special cases. Also, because of the well-defined environment of operation, the message exchange protocol was defined to avoid kernel mode interaction and allow for access to the NIC from user mode. Finally, because of the direct access to the NIC, unnecessary copying of the data into kernel buffers was also eliminated since the user is able to directly transfer data from user-space to the NIC. In addition to the standard send/receive operations that are typically available in a networking library, the VIA provides Remote Direct Memory Access (RDMA) operations where the initiator of the operation specifies both the source and destination of a data transfer, resulting in zero-copy data transfers with minimum involvement of the CPUs.

The InfiniBand Architecture uses basically the VIA primitives for its operation at the transport layer. In order for an application to communicate with another application over the InfiniBand it must first create a work queue that consists of a queue pair (QP). In order for the application to execute an operation, it must place a work queue element (WQE) in the work queue. From there, the operation is picked-up for execution by the channel adapter. Therefore, the Work Queue forms the communications medium between applications and the channel adapter, relieving the operating system from having to deal with this responsibility.

Each process may create one or more QPs for communications purposes with another application. Instead of having to arbitrate for the use of the single queue for the NIC card, as in a typical operating system, each queue pair has an associated context. Since both the protocol and the structures are all very clearly defined, queue pairs can be implemented in hardware, thereby off-loading most of the work from the CPU. Once a WQE has been processed properly, a completion queue element (CQE) is created and placed in the completion queue. The advantage of using the completion queue for notifying the caller of completed WQEs is that it reduces the interrupts that would be otherwise generated.

High speed serial fabrics such as the InfiniBand architecture may also be used for connecting multiple components (boards) communicating to one another within a single chassis over a common fabric or switched fabric. For instance, a new standard, AdvancedTCA™ (Advanced Telecommunications Compute Architecture), is currently being developed out of the industry forum PCI Industrial Computer Manufacturers Group, which previously formulated the CompactPCI™ standard. CompactPCI™ is a variation of the Eurocard form factor that uses PCI buses in a back plane. The Eurocard form factor is a physical form factor of line cards that have a front panel. A line card has a solid face plate with handles, slides into the front of a chassis by the use of guides, and makes contact with a backplane or midplane within the chassis. This allows direct access to the cards unlike a PC chassis or server where a lid is opened to expose the PCI cards sitting inside the chassis. AdvancedTCA™ defines star and meshed topologies for a packet switched fabric in the back plane of a chassis. The proposed meshed fabric solution utilizes Infiniband technology and a meshed fabric solution. However, the design methodology being proposed potentially puts a switch on every single board in the chassis. For example, suppose there are 16 boards or slots in a chassis, if a 16 port switch exists on every single board, 16 switches are required in the chassis. Each board communicates with all other boards to form a meshed or switched fabric.

This potentially is an inefficient methodology to transport data across a mesh. For example, this may require a Target Channel Adaptor (TCA) between the CPU and a switch on a board, followed by a switch communicating to another switch across a meshed back plane, followed by another TCA to the CPU on a receiving board, creating numerous hops and points of potential congestion.

All switch devices have a given amount of inefficiency based upon their queuing logic. Most often, this leads to head-of-line blocking in the switch because multiple contenders are vying for a single bottle neck. However, by placing multiple queues both inbound and outbound, for each port on the switch, these head-of-line blocking latencies can be largely removed. A single device that incorporates such a queuing model is both costly and large, almost too large and expensive to put into a single piece of usable silicon. However, by distributing this functionality across multiple components, using the inherent cross-connect of the meshed backplane, an efficient logical distributed switch may be built at much lower cost and higher efficiency.

Therefore, a simpler solution is to transport data from a TCA on a board directly to the TCA on another board through a meshed backplane. Communication from TCA to TCA requires putting more ports on each individual TCA (16 for example) along with the appropriate input and output buffering on each TCA. This proposed solution essentially creates one large logical distributed switch that may be more efficient in many ways, i.e., less costly, lower power, etc.

Embodiments of the present invention exists within the context of connecting multiple entities within a system (specifically multiple boards within a chassis), using multiple TCAs. The components consist of multi-port TCAs and a meshed backplane that is equipped to mount boards via connectors on the backplane. A multi-port TCA capable of performing multiple bridging functions simultaneously i.e., bridging from an Infiniband meshed backplane to multiple local busses, i.e., Gigabit Ethernet, Fibre Channel, and TCP/IP devices, is referred to as a Fabric Interconnect Chip (FIC). FIG. 1 depicts the connection of a FIC 100 that interconnects between local components on a board (local busses) 120 and a backplane mesh fabric 110.

Figure 2:
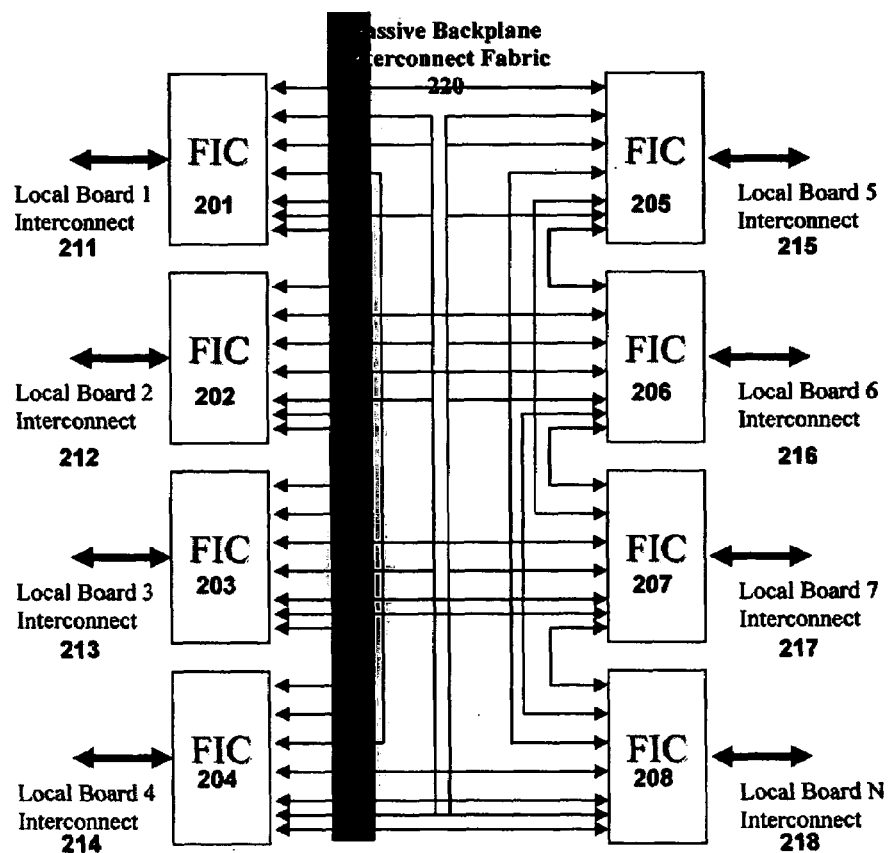
FIG. 2 depicts connection of multiple interconnected Fabric Interconnect Chips according to an embodiment of the present invention.

FIG. 2 depicts connection of multiple interconnected FICs. Each board 211–218 on the mesh 220 contains one FIC 201–208. Each FIC may provide an interconnection to every other board in the shelf (chassis). FIG. 2 shows an 8-way (8 board) mesh, but any size mesh is realizable, hence the $8^{th}$ board 218 is labeled "N". The lines drawn show how the traces from each FIC 'port' travels across the passive backplane interconnect fabric 220 to its corresponding 'port' on another FIC, (located on another board).

The FIC provides data queuing first in first out (FIFOs) on both its inbound and outbound sides for each of its multiple ports. By placing FICs on every board within a chassis that is connected to the meshed backplane, the boards can inter-communicate with each other in a "meshed" topology. Therefore, every board has a point to point connection with every other board in the backplane, making a complete cross-connect without the need for a separate switch device.

Figure 3:
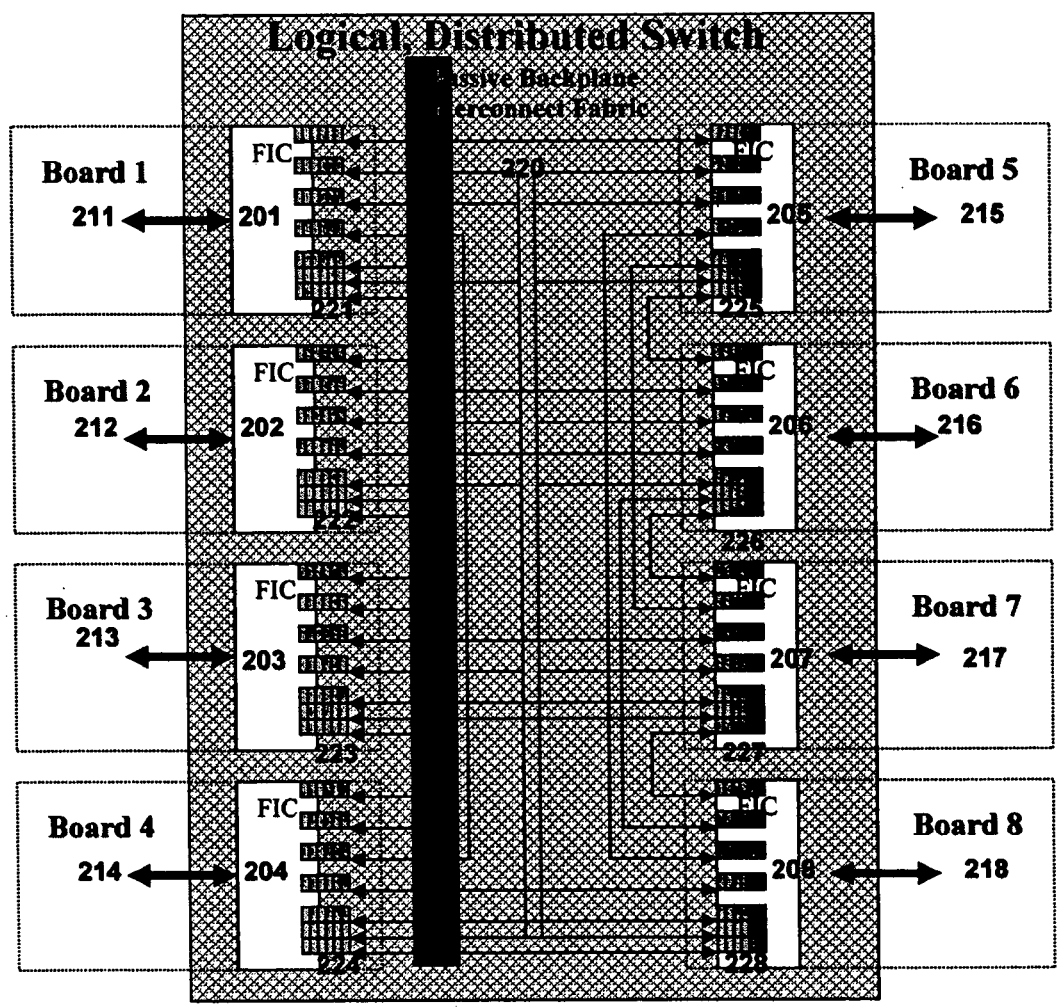
FIG. 3 illustrates a logical switch distributed across many boards according to an embodiment of the present invention.

In addition, by incorporating the queuing logic on both the inbound and outbound sides of the FIC, coupled with the inherent cross-connect of the mesh, a logical, distributed switch is created, without really having a switch device. FIG. 3 illustrates the same 8-way mesh depicted in FIG. 2, highlighting the logic switch which is created by distributing the switch function across FICs 201–208 on all the boards 211–218. Each multi-port FIC 201–208 is shown having inbound and outbound queues 221–228 for each port. In total, what is depicted is a 8-way logical distributed switch, where each local bus (board 211–218) represents an access point on the logical switch.

Since each FIC (201–208) has queuing (221–228) on both the inbound and outbound sides, coupled with the inherent cross-connect in the backplane 220, an extremely efficient logically distributed switch can be built at much lower cost, greater reliability, higher efficiency, lower power and lower latency than a typical, centrally switched topology, or any architecture that places a switch on every board of a meshed topology.

To better appreciate the efficiency improvements created by the FIC queuing strategy, a discussion on the issues of flow control, congestion control and Quality of Service may be helpful.

Links are the connections between boards (or node to node, or switch to switch, in general). They are capable of transmitting no more than a certain amount of information at any one time, known as bandwidth. Bandwidth may be measured, for example, in bits/second. In general, there is no restriction on the number of boards (N) except that it be greater than 1.

A flow is a set of packets that all share a set of characteristics. Typically, the characteristics include the source and destination address of the packet, as well as its protocol type and possibly its priority or classification. It is important that all the packets in a flow maintain a certain sequence in which they were sent, preferably arriving at their destination in that same sequence. If they do arrive out of sequence they can be re-sequenced, or put back in order. However, it is not desireable to re-sequence packets at the end. Therefore, a good design attempts to keep all the packets in a flow in sequence all through the network so that they arrive at the far end in sequence and do not require re-sequencing.

A common problem for any network is how to provide Quality of Service (QoS) through a network. To provide QoS, the network traffic must be differentiated, i.e., classified according to service levels. Some traffic should be handled in one way, other traffic another.

For example, an entity may set up a Service Level Agreement (SLA) with a network service provider (the entity that is providing the network), that specifies that the entity's traffic will always have available a certain bandwidth (e.g., 10 Megabits per second, or 10 Mbps) and latency (e.g., less than 1 millisecond, or ms). Then, whenever a packet is detected that comes from or is going to that entity, the packet should receive special handling. If the overall flow to the entity is currently less than 10 Mbps, then the packet should get through without being dropped and with a latency of less than 1 ms. This type of flow is said to be handled by Assured Forwarding (AF). Packets arriving when the current flows are greater than 10 Mbps will be handled differently, perhaps as Best Effort (BE) traffic (see below).

As another example, a router may be set up to recognize certain types of flows as real-time flows. Real-time flows are characterized by the idea that if the packet doesn't arrive in time it might as well not arrive at all. For example, a packet of voice data in a telephone conversation has to be available at the receiver when it is needed, or it is useless. Too late, and it cannot be used and will just be discarded. So real-time traffic (a stream of packets) belonging to a voice conversation should be handled by a class of behavior known as Expedited Forwarding (EF). A packet handled this way will be forwarded very quickly (with low latency). Hopefully, the variation in latency (known as jitter) will also be low. As a tradeoff, packets in such a stream may be simply dropped if their aggregate bandwidth exceeds a certain threshold. Also, a SLA covering such packets may be expensive to the buyer because providing this kind of service requires that a router have features that make it expensive to build.

A third example is for traffic that is not covered by any SLA, which is called Best Effort (BE) traffic. This type of traffic is typically found now across the Internet. Best effort packets may be dropped for any reason, and have no particular guarantees about latency or jitter.

Figure 4:
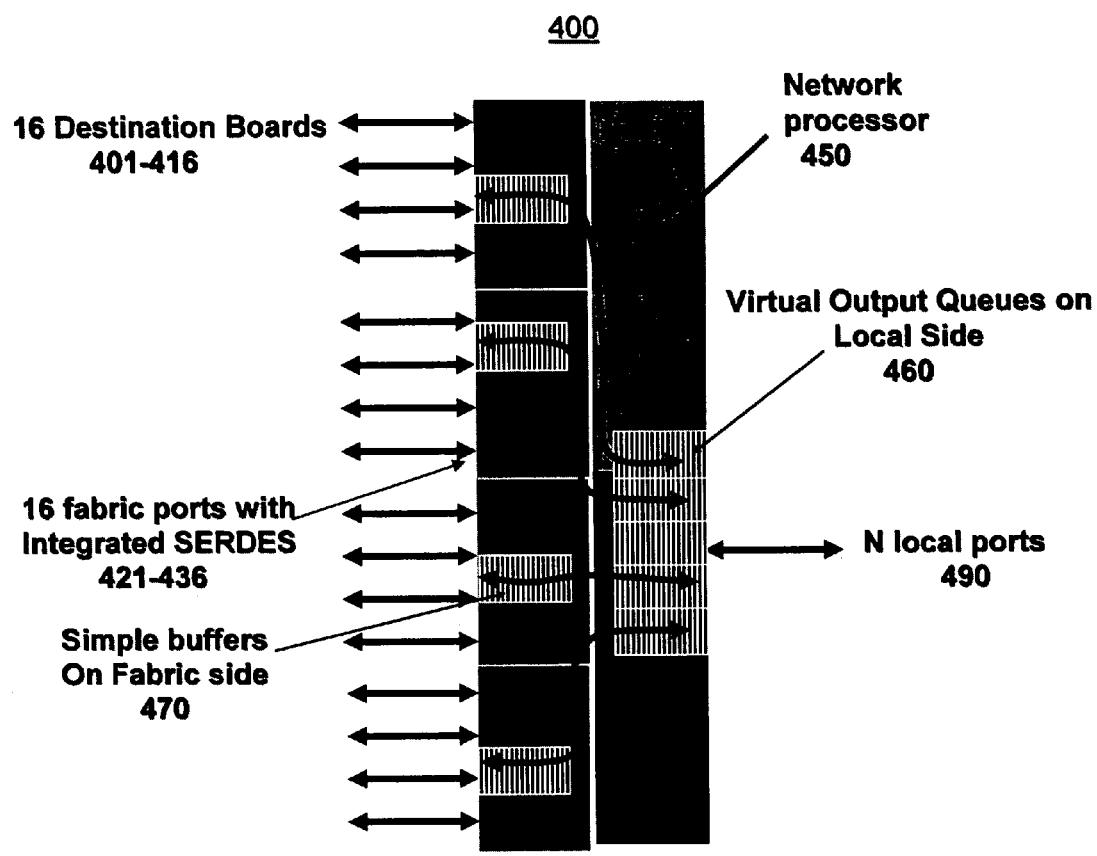
FIG. 4 illustrates processing of packets from ingress to fabric input according to an embodiment of the present invention.

Processing of packets from ingress to fabric input is shown in FIG. 4. Depicted is the flow of packets through a single FIC 400 located on a board going to 16 destination boards 401–416. A network processor 450 on the FIC 400 classifies all outgoing traffic to a particular flow. The flow defines a set of parameters including the 16 destination boards 401–416, the path by which it will get to the destination board, i.e., one of the 16 fabric ports 421–436, and classification (AF, EF or BE). The individual packets end up in virtual output (send) queues 460 according to the classification. There is a separate set of virtual output (send) queues 460 (AF, EF or BE) for every destination point, i.e., fabric port 421–436, per FIC. The fabric ports 421–436 and N local ports 490 have both send and receive terminals.

Multiple virtual output (send) queues 460 are maintained per FIC for two reasons. The primary reason is that multiple virtual output queues 460 provide a steering function. After classification, the destination board 401–416 has been identified. If the packets were put back into the same (common) queue, the destination board 401–416 information would have to be carried along with the packet. This scheme is in fact done in some implementations. However, separating the packets into separate queues is another way to carry the information.

The second reason is to prevent head-of-line blocking. This occurrence should be a rare condition (the boards should not back up very often, but it can happen, and separate queues prevent this condition). Head-of-line blocking would occur if there were only a single outbound queue, and if, for example, a packet slated to go board 2 were in front of a packet slated to go to board 3, and board 2 was heavily loaded but board 3 was not. The packet slated to go to board 3 would be unable to be taken off the queue because board 2 would be unavailable, and it would block the packet slated for board 3, even though the packet slated for board 3 could go if it could get off the queue.

InfiniBand offers link layer Virtual Lanes (VLs) to support multiple logical channels (i.e. multiplexing) on the same physical link. Infiniband offers up to 16 virtual lanes per link. VLs provide a mechanism to avoid head-of-line blocking and the ability to support Quality of Service (QoS). The difference between a Virtual Lane and a Service Level (SL) is that a Virtual Lane is the actual logical lane (multiplexed) used on a given point-to-point link. The Service Level stays constant as a packet traverses the fabric, and specifies the desired service level within a subnet. The SL (AF, EF or BE) is included in the link header, and each switch maps the SL to a VL supported by the destination link. A switch supporting a limited number of virtual lanes will map the SL field to a VL it supports. Without preserving the SL, the desired SL (AF, EF or BE) would be lost in this mapping, and later in the path, a switch supporting more VLs would be unable to recover finer granularity of SLs between two packets mapped to the same VL.

In the case of the FIC 400 shown in FIG. 4, the virtual lanes are established by classifying, sorting, and placing packets, according to service level and destination, into the virtual output queues 460. The packets are then multiplexed onto a link via a fabric port 421–436 to be transmitted to a destination board 401–416. The classifying, sorting, placing and multiplexing are carried out by the network processor 450.

FIG. 4 also illustrates simple buffers (receive queues) 470 on the egress fabric side. The 16 fabric ports 421–436 have integrated serializer/de-serializers (SERDES). By allocating buffers (queues) to each port on both the receive and transmit sides, traffic can be managed without head of line blocking or congestion. This enables each board to have a private communications channel with every other board in the system.

Today, boards in a common chassis interconnect to each other over copper traces embedded in the chassis backplane. Existing backplanes use copper traces within a PCB substrate to establish the communications paths between boards. Topologies such as common bus PCI and switched star (i.e. some Ethernet approaches) are popular today. The copper traces and the electrical drivers that communicate over them are limited in terms of their capacity to carry data bandwidth with respect to the Local Area Network (LAN) and Wide Area Network (WAN) optical signals that these boards are intended to terminate.

Fabric backplanes are used for data communications between two or more boards located within a common chassis. Mesh topologies have certain performance and availability advantages over bus and star configurations. However, in a copper backplane, meshed topologies are generally more expensive and require far more pins to implement.

As communications rates grow, the need for faster back plane technologies also grows. The limits of performance on copper traces within a PCB substrate will soon be reached giving rise to the need to investigate optical interconnects for the backplane. Optical fibers may be employed to provide increased bandwidth while using only a few fibers in a small space. Copper traces, on the other hand, often have to contain multiple (parallel) interconnects in order to achieve a limited bandwidth.

One alternative is to use optical fibers to create an optical backplane fabric. The optical backplane may consist of either a mesh of individual optical fibers or a redundant pair of fibers configured in a counter-rotating ring topology. Either way, fibers represent a much wider bandwidth potential than copper, although a ring requires less fibers than a mesh. When using a mesh, each board will have a direct connection to every other board in the chassis using an optical fiber. Each port on a board may have a transmitter/receiver pair connected to a single fiber.

The issue with using a ring, however, is how to map the addressing of multiple boards across these fibers. One solution is to employ Wavelength Division Multiplexing (WDM). A WDM optical mesh defines a meshed-topology in the wavelength space as opposed to the physical fiber space. By utilizing multiple discrete lambda-waves as optical carriers such that by meshing dedicated optical wavelengths between every two boards, layer 2 protocols are eliminated, thereby creating a dramatic improvement in the efficiency of the transport. Today, every packet transport requires a protocol that allows the end point (and intermediate points) to decipher the intended path (or consumer) of the packet. This protocol increases the amount of overhead required in the packet bus, allowing less room for actual data to be sent. By moving the protocol into the wavelength of the actual optical signal, the destination is implied by the wavelength and no additional bandwidth needs to be surrendered on the signal to provide this information. This makes the efficiency of the transport better and also speeds the routing of the packet through the network. In addition, the use of optical interconnects in a backplane environment greatly increases chassis bandwidth as well as reducing electrical radiation that often accompanies copper interconnects. The components involved include an optical backplane in a physical ring topology, and the necessary transmitters and receivers for the size of the installation (i.e., number of slots in the chassis). In addition, optical add/drop multiplexer devices are required.

Figure 5:
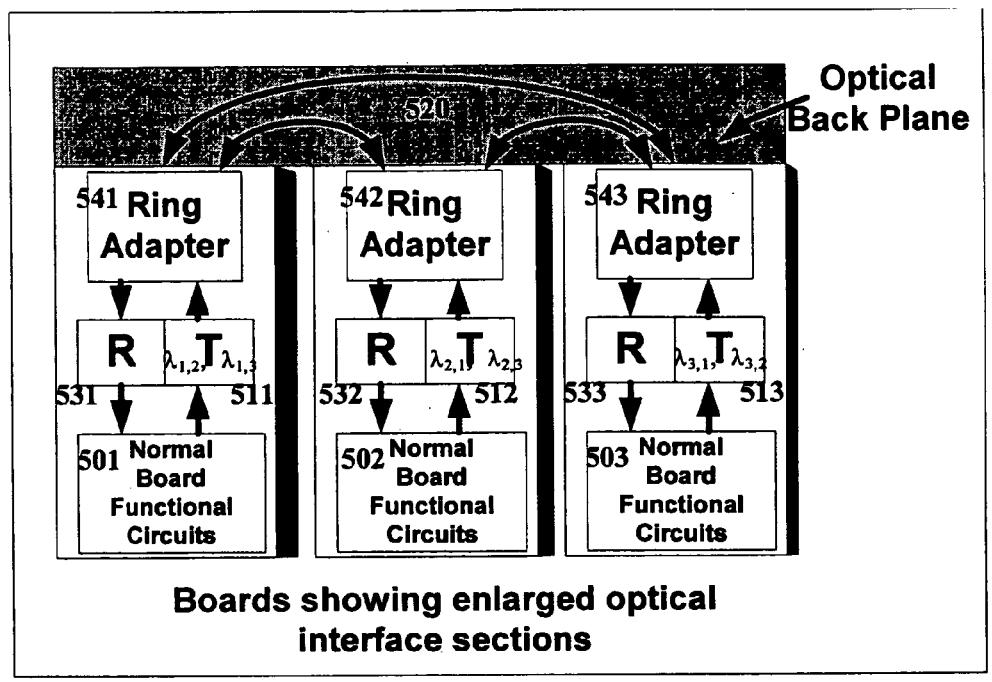
FIG. 5 shows a high-level diagram of a system utilizing a dual-counter-rotating ring topology according to an embodiment of the present invention.

FIG. 5 shows a high-level diagram of a system utilizing a dual-counter-rotating ring topology as an optical backplane according to an embodiment of the present invention. The concept is not limited to any particular number of boards in a chassis or shelf, but 3 boards is chosen to simplify the illustration. Each board 501–503 has transmitters 511–513 for each wavelength needed. The number of wavelengths needed is equal to the number of boards minus one, in the system. In a counter-rotating ring topology, there are two physical rings, each carrying the same traffic flows but moving in opposite directions. Each board 501–503 transmits in both directions across the dual counter-rotating ring topology 520 such that that loss of any one board (due to removal or failure) will not disrupt communications with the other boards.

Each board 501–503 reserves one wavelength for each other board in the system. Therefore, in the 3 board diagram shown in FIG. 5, each board provides 2 wavelengths, one for each board in the system, less itself. Correspondingly, each board has a pair of receivers 531–533 to transduce the optical signals sent from the transmitters 511–513 on each of the other boards 501–503. To implement two counter-rotating rings, for each individual board, there is one transmitter and one receiver for each other board in the system, per ring.

In the 3 board example, there are 6 wavelengths: $\lambda_{1,2}$, $\lambda_{1,3}$, $\lambda_{2,1}$, $\lambda_{2,3}$, $\lambda_{3,1}$, $\lambda_{3,2}$. The first board 501 transmits $\lambda_{1,2}$, to board 2 502 and $\lambda_{1,3}$ to board 3 503; and receives: $\lambda_{2,1}$ from board 2 502 and $\lambda_{3,1}$ from board 3 503.

Since each wavelength is transmitted by only one board and consumed by only one board, each wavelength uniquely identifies both a source and destination across the optical backplane 520. This provides a substantial improvement in efficiency over current day solutions from the standpoint of a reduction in protocol overhead. The mesh topology is preserved through the meshing of wavelengths; each containing dedicated bandwidth between any two end points.

Between multiplexing and demultiplexing points in a WDM system, there is an area in which multiple wavelengths exist (i.e., the dual counter-rotating rings). It is necessary to remove or insert one or more wavelengths at points along the dual-counter-rotating rings. Demultiplexing must be done before the optical signal is detected, because photo detectors are inherently broadband devices that cannot selectively detect a single wavelength. An optical add/drop multiplexer (OADM) performs this function. The OADM can add, pass, and remove wavelengths. There are two general types of OADMs. The first is a fixed device that is physically configured to drop specific predetermined wavelengths, while adding others. The second type is reconfigurable and capable of dynamically selecting which wavelengths are added and dropped.

Thin-film filters have emerged as the technology of choice for OADMs because of their low cost and stability. For the emerging second generation of OADMs, other technologies, such as tunable gratings and circulators, may come into prominence.

Figure 6:
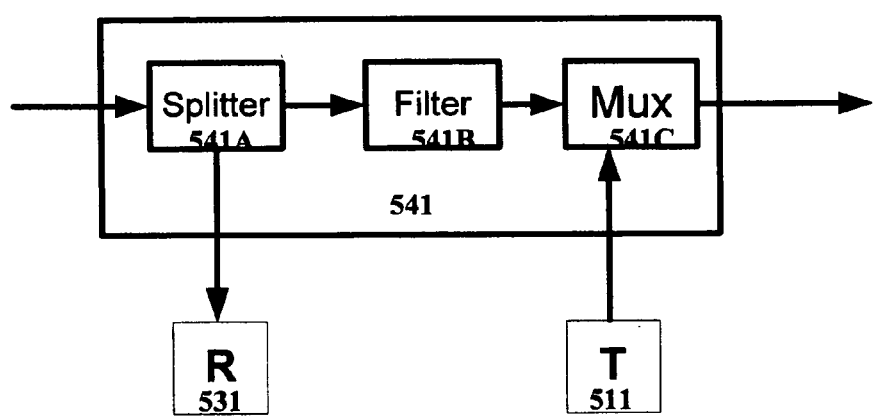
FIG. 6 illustrates an optical add/drop multiplexer (OADM) according to an embodiment of the present invention.

FIG. 6 illustrates a ring adaptor utilizing an OADM according to an embodiment of the present invention. The blocks show how the ring adapter 541 shown previously in FIG. 5 may consist of a splitter 541A to route traffic towards the receiver 531, a filter 541B to eliminate wavelengths generated by the transmitters and a multiplexer 541C to add the new wavelengths received from the transmitters 511 back into the optical stream.

Figure 7:
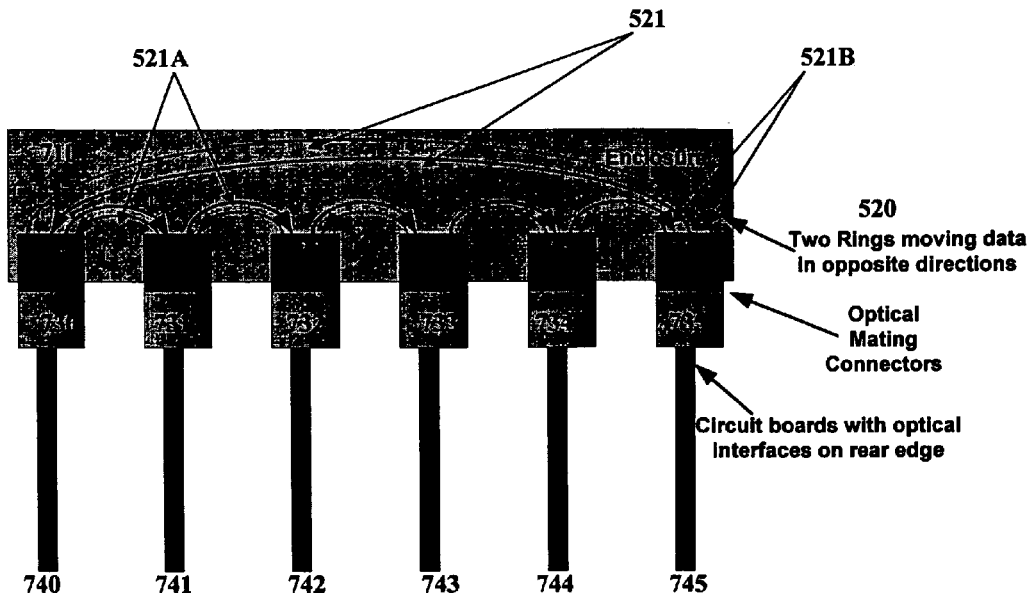
FIG. 7 illustrates circuit boards mating to connectors according to an embodiment of the present invention.

Referring to FIG. 7, the basic components of the dual counter-rotating ring optical backplane include a set of fibers 521, arranged in a dual-counter-rotating ring 520, housed in a overlay module 710 that allows fiber cavity mechanical connectors 720–725 to mount to the overlay module 710 front surface. Each mechanical connector 720–725 mates up to a mated connector 730–735 that mounts to the individual boards 740–745 in a chassis. Mechanical connectors 720–725 may also contain an OADM 541 ring adaptor previously depicted in FIG. 5 and FIG. 6.

Figure 8:
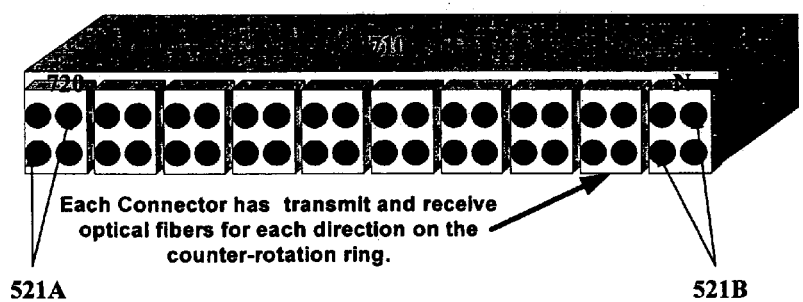
FIG. 8 illustrates an Optical Backplane Overlay Module according to an embodiment of the present invention.

FIG. 8 illustrates an overlay module according to an embodiment of the present invention. The overlay module 710 includes a series of connectors 720-N mounted to the front of the enclosure. The overlay module 710 contains the optical fibers 521 that form the dual counter-rotating ring 520. Referring to FIG. 7 and FIG. 8, each connector 720–725 has transmit 521A and receive 521B optical fibers for each direction on the counter-rotation ring 520. Each connector 720–725 (720-N) has transmit 521A and receive fiber 521B in each direction to each of its nearest neighbors. Fibers 521 pass between the two end connectors 720, 735 (720, N) to complete the rings 520.

Figure 9:
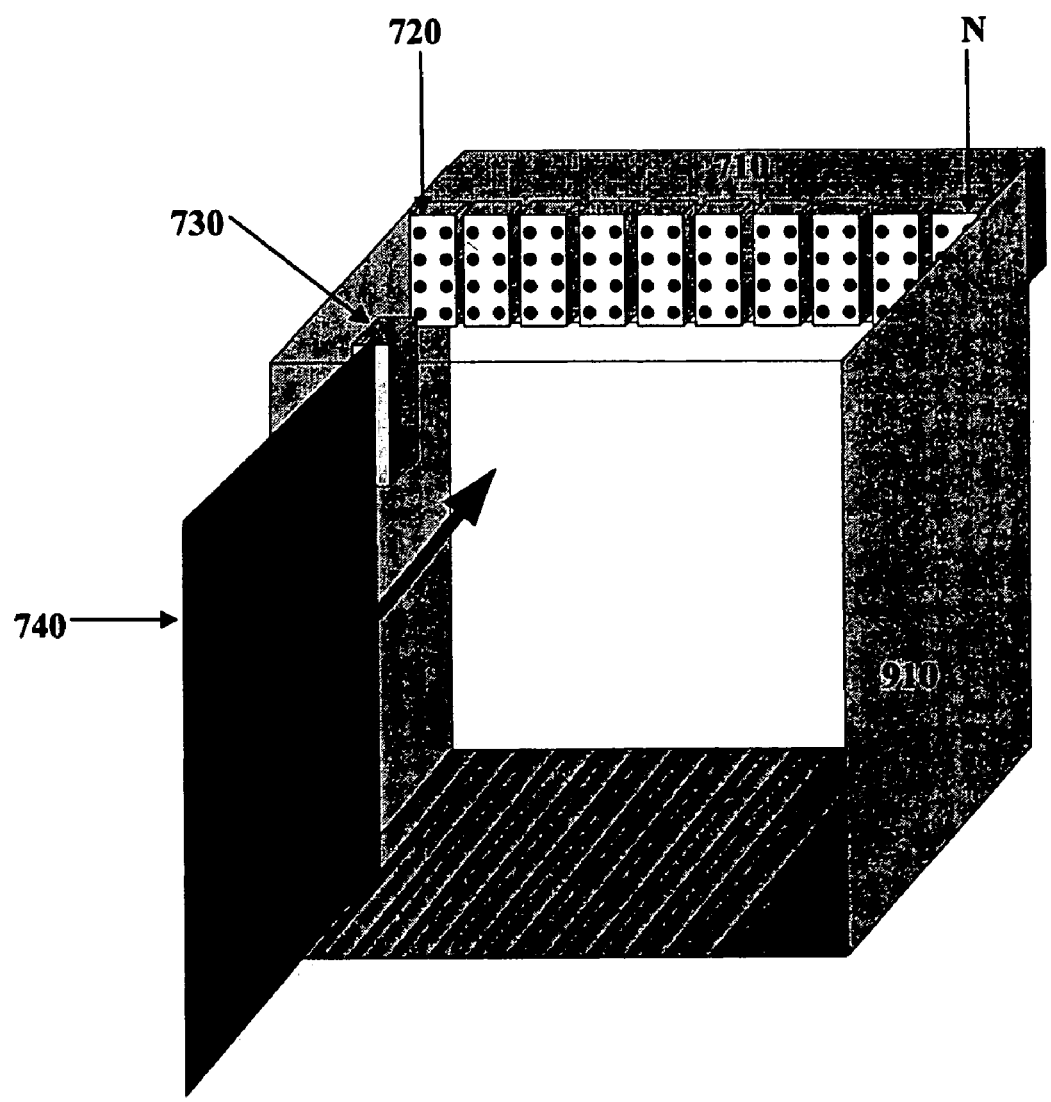
FIG. 9 illustrates a mechanical view of a chassis containing the Optical Backplane Overlay Module according to an embodiment of the present invention.

FIG. 9 illustrates a mechanical drawing of the position of the optical overlay module 710 in the AdvancedTCA Eurocard chassis 910 according to an embodiment of the present invention. The boards 740-N used in this approach are a "Euro-card" style front insertion type of board. As the board 740 is inserted to the chassis 910, the optical connectors 730 on the board's back edge align with and mate into the connector 720 provided by the overlay module 710. The overlay module 710 sits at the top in the rear panel access area. Once the board 740 is inserted, the board's optical transceivers (not shown) interconnect to the optical fiber ring 520 that is contained in the overlay module 710. All other boards 741-N inserted to this chassis 910 will also connect to the overlay module 710 and become peer members of the optical ring. The optical overlay module 710 will mount in any Eurocard chassis 910 and can function in addition to a traditional copper backplane that would provide power and management to the individual boards.

While the description above refers to particular embodiments of the present invention, it will be understood that many modifications may be made without departing from the spirit thereof. The accompanying claims are intended to cover such modifications as would fall within the true scope and spirit of the present invention. The presently disclosed embodiments are therefore to be considered in all respects as illustrative and not restrictive, the scope of the invention being indicated by the appended claims, rather than the foregoing description, and all changes which come within the meaning and range of equivalency of the claims are therefore intended to be embraced therein.

What is claimed is:

1. A high speed serial fabric backplane comprising:
a plurality of circuit boards interconnected to one another through a fabric of conductors, each circuit board containing a fabric interface chip (FIC);
each FIC having a direct individual connection via a conductor of the fabric of conductors to all other FICs each FIC providing an interface between another conductor of the fabric of conductors on a fabric side and a local node on a local side, each FIC including a plurality of local ports to interface with a plurality of local nodes, and a plurality of destination specific fabric ports to interface with a plurality of conductors of the fabric of conductors, each FIC including a plurality of destination specific send queues and a plurality of receive queues to interface with the plurality of local ports and the plurality of destination specific fabric ports, a destination specific send queue interfacing with both a local port and a destination specific fabric port, a receive queue interfacing with both a local port and a destination specific fabric port, and each destination specific fabric port interfacing with multiple destination specific send queues.

2. The high speed serial fabric backplane according to claim 1, wherein the multiple destination specific send queues include best effort queues, expedited forwarding queues, and assured forwarding queues.

3. The high speed serial fabric backplane according to claim 2, wherein the FIC includes a network processor to classify, prioritize, route, and multiplex signals from the plurality of local ports and the plurality of destination specific fabric ports.

4. The high speed serial fabric backplane according to claim 3, wherein the network processor functions as a bridge between network protocols on the local side and network protocols on the fabric side.

5. The high speed serial fabric backplane according to claim 4, wherein the fabric of conductors includes a plurality of optical fibers.

6. The high speed serial fabric backplane according to claim 5, wherein the plurality of optical fibers is arranged in a dual counter rotating ring topology.

7. A multi-port Fabric Interconnect Chip (FIC) comprising:
a network processor;
a plurality of local ports;
a plurality of destination specific fabric ports;
a plurality of destination specific send queues; and
a plurality of receive queues, the plurality of local ports interfacing with a plurality of local nodes, and the plurality of destination specific fabric ports interfacing with a plurality of conductors of a fabric of conductors, the plurality of destination specific send queues and the plurality of receive queues interfacing with the plurality of local ports and the plurality of destination specific fabric ports, a destination specific send queue interfacing with both a local port and a destination specific fabric port, a receive queue interfacing with both a local port and a destination specific fabric port, each destination specific fabric port interfacing with multiple destination specific send queues.

8. The multi-port FIC according to claim 7, wherein the multiple destination specific send queues per destination specific fabric port includes best effort queues, expedited forwarding queues, and assured forwarding queues.

9. The multi-port FIC according to claim 8, wherein the network processor classifies, prioritizes, routes, and multiplexes signals from the plurality of local ports and the plurality of destination specific fabric ports.

10. The multi-port FIC according to claim 9, wherein the network processor functions as a bridge between network protocols used on the local nodes and network protocols used on the fabric of conductors.

11. An optical fabric backplane comprising:
a plurality of circuit boards interconnected to one another through a fabric of optical fibers, each circuit board containing a fabric interface chip (FIC);
each FIC having a direct individual connection via an optical fiber of the fabric of optical fibers to all other FICs, each FIC providing an interface between an optical fiber of the fabric of optical fibers on a fabric side and a local node on a local side, each FIC including a plurality of local ports to interface with a plurality of local nodes, and a plurality of destination specific fabric ports to interface with a plurality of optical fibers of the fabric of optical fibers, each FIC including a plurality of destination specific send queues and a plurality of receive queues to interface with the plurality of local ports and the plurality of destination specific fabric ports, a destination specific send queue interfacing with both a local port and a destination specific fabric port, a receive queue interfacing with both a local port and a destination specific fabric port, each destination specific fabric port interfacing with multiple destination specific send queues.

12. The optical fabric backplane according to claim 11, wherein the multiple destination specific send queues include best effort queues, expedited forwarding queues, and assured forwarding queues.

13. The optical fabric backplane according to claim 12, wherein the FIC includes a network processor to classify, prioritize, route, and multiplex signals from the plurality of local ports and the plurality of destination specific fabric ports.

14. The optical fabric backplane according to claim 13, wherein the network processor functions as a bridge between network protocols on the local nodes and network protocols on the fabric side.

15. The optical fabric backplane according to claim 14, wherein the fabric of optical fibers is arranged in a dual counter rotating ring topology.

16. The optical fabric backplane according to claim 15, wherein a FIC transmits a separate wavelength of light per all other FICs via a optical fiber of the fabric of optical fibers to all other FICs.

17. The optical fabric backplane according to claim 16, wherein each FIC has associated with it a plurality of optical add/drop multiplexers (OADMs) each corresponding to a FIC of the plurality of FICs.

* * * * *